(12) United States Patent
Li et al.

(10) Patent No.: US 11,805,711 B2
(45) Date of Patent: Oct. 31, 2023

(54) PHASE-CHANGE MEMORY (PCM) INCLUDING LINER REDUCING RESISTANCE DRIFT

(71) Applicant: International Business Machines Corporation, Armonk, NY (US)

(72) Inventors: Ning Li, White Plains, NY (US); Joel P. de Souza, Putam Valley, NY (US); Kevin W. Brew, Niskayuna, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 17/034,057

(22) Filed: Sep. 28, 2020

(65) Prior Publication Data
US 2022/0102626 A1 Mar. 31, 2022

(51) Int. Cl.
*H10N 70/20* (2023.01)
*H10B 63/00* (2023.01)
*H10N 70/00* (2023.01)

(52) U.S. Cl.
CPC .......... *H10N 70/231* (2023.02); *H10B 63/00* (2023.02); *H10N 70/021* (2023.02); *H10N 70/063* (2023.02); *H10N 70/841* (2023.02); *H10N 70/8833* (2023.02)

(58) Field of Classification Search
CPC .................................................. H10N 70/20
See application file for complete search history.

(56) References Cited

U.S. PATENT DOCUMENTS

| | | | |
|---|---|---|---|
| 10,043,576 B2 | 8/2018 | Robustelli | |
| 10,056,546 B2 | 8/2018 | BrightSky et al. | |
| 10,373,679 B1 | 8/2019 | Lee et al. | |
| 10,741,756 B1 * | 8/2020 | Ok | H01L 45/144 |
| 2009/0130797 A1 | 5/2009 | Lee | |
| 2009/0303780 A1 | 12/2009 | Kasko | |
| 2010/0127232 A1 | 5/2010 | Boeve | |
| 2013/0026436 A1 | 1/2013 | Breitwisch | |
| 2014/0124725 A1 | 5/2014 | Chi | |
| 2015/0188048 A1 | 7/2015 | Wang | |
| 2016/0087198 A1 | 3/2016 | Chang | |
| 2017/0331036 A1 * | 11/2017 | Collins | H01L 45/1675 |
| 2019/0123269 A1 | 4/2019 | Mo | |
| 2019/0123273 A1 | 4/2019 | Lee | |

(Continued)

FOREIGN PATENT DOCUMENTS

EP 2034536 3/2009

OTHER PUBLICATIONS

UK Intellectual Property Office, Combined Search and Examination Report under Sections 17 and 18(3), Application No. GB2113289.9, total pp. 11, dated Feb. 28, 2022.

(Continued)

*Primary Examiner* — Marvin Payen
(74) *Attorney, Agent, or Firm* — Daniel Morris; Otterstedt & Kammer PLLC (57) ABSTRACT

A Phase-Change Memory (PCM) device includes a dielectric layer, a bottom electrode disposed in the dielectric layer, a liner material disposed on the bottom electrode, a phase-change material disposed on the liner material, and a top electrode disposed on the phase-change material and in the dielectric layer.

20 Claims, 4 Drawing Sheets

(56) References Cited

U.S. PATENT DOCUMENTS

2019/0172532 A1   6/2019   Futase
2020/0135807 A1   4/2020   Brew

OTHER PUBLICATIONS

Mugwanga et al., "Characterization of aluminum doped zinc oxide (Azo) thin films prepared by reactive thermal evaporation for solar cell applications," J Fundam Renewable Energy Appl 5, No. 170, Apr. 2015: 2, pp. 1-6.

Godlewski, "Aluminum-doped zinc oxide conducting films," EAGLE, http://www.eagle-regpot.eu/Efl/index.php?pid=45&l=en, downloaded Mar. 2020, pp. 1-2.

Laura Garlick, Elkington & Fife, Before the The UK Intellectual Property Office, related UK Patent Application No. 2113289.9, Office Action Response, total pp. 20, filed Sep. 28, 2022.

German Patent and Trademark Office, German Office Action, Counterpart German Case DE102021122555.8 6 pages total Feb. 28, 2022.

Dr Michael Schmid, Richardt Patentanwalte PartG mbB, Before German Patent and Trademark Office, Response to German Office Action, Counterpart German Case DE102021122555.8 46 pages total dated May 4, 2022.

\* cited by examiner

PHASE-CHANGE MEMORY (PCM) INCLUDING LINER REDUCING RESISTANCE DRIFT

BACKGROUND

The present invention relates to memory devices and more particularly to improved Phase-Change Memory (PCM) devices.

Neuromorphic engineering, also known as neuromorphic computing, is a concept describing the use of very-large-scale integration (VLSI) systems containing electronic analog circuits to mimic neuro-biological architectures present in the nervous system.

Applications of these neuro-biological architectures to machine learning can be accelerated by using analog chips containing phase-change memory (PCM). PCM is based on a chalcogenide glass material, which changes its phase from crystalline to amorphous and back again when suitable electrical currents are applied. Each phase has a differing resistance level, which is stable until the phase is changed. The maximum and minimum resistance levels in a PCM device are the basis for binary one or zero values.

PCM devices are non-volatile and access latency is at DRAM levels, making them an example of storage-class memory. The Intel-Micron 3D XPoint technology is a binary memory based on PCM. PCM can be programmed to varying resistance states between the maximum and minimum resistance states depending on the proportion of amorphous to crystalline phase present, providing an analog state for neuromorphic computation.

BRIEF SUMMARY

According to an embodiment of the present invention, a Phase-Change Memory (PCM) device includes a dielectric layer, a bottom electrode disposed in the dielectric layer, a liner material disposed on the bottom electrode, a phase-change material disposed on the liner material, and a top electrode disposed on the phase-change material and in the dielectric layer.

According to some embodiments, method of manufacturing a Phase-Change Memory (PCM) device comprises providing a substrate, forming a first structure comprising a first dielectric layer and a bottom electrode, wherein the bottom electrode is disposed in the first dielectric layer and the bottom electrode and the first dielectric layers are disposed on the substrate, forming a liner material disposed on the bottom electrode and in a second dielectric layer, forming a phase-change material on the liner material and in a third dielectric layer, and forming a top electrode disposed on the phase-change material and in a fourth dielectric layer.

According to some embodiments, a Phase-Change Memory (PCM) device comprises a dielectric layer, a first electrode disposed on a first side of the dielectric layer, a second electrode disposed on a second side of the dielectric layer, opposite the first electrode, a phase-change material disposed on the dielectric layer and the first and second electrodes, and a liner material disposed on the phase-change material.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide for:

reduced resistant drift in PCM devices; and reduced programming current in said devices.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Preferred embodiments of the present invention will be described below in more detail, with reference to the accompanying drawings.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Back-End Of Line (BEOL) compatible Phase-Change Memory (PCM) cross-point memory and neuromorphic computing crossbar arrays (see FIG. 1) of non-volatile memories can accelerate the training of fully connected neural networks by performing computations at the location of the data. Resistance drift is a problem for using Phase-Change Memory (PCM) as analog memory in neuromorphic computing devices. Embodiments of the present invention relate to an improved PCM structure.

Figure 1:
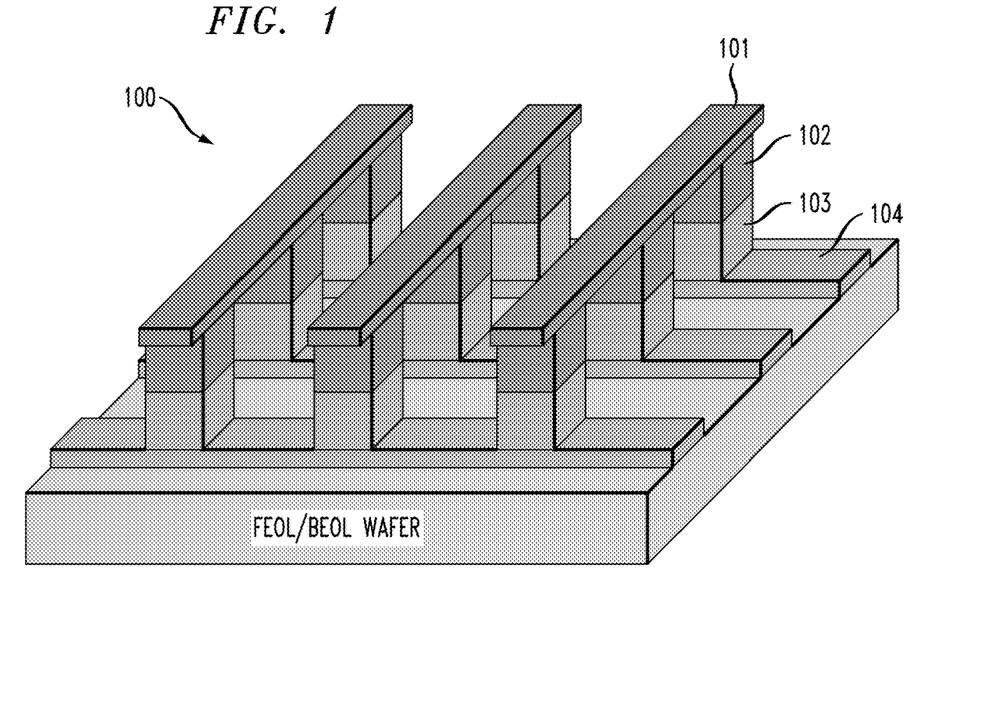
FIG. 1 is an exemplary PCM cross-point memory and neuromorphic computing crossbar arrays according to some embodiments of the present invention.

Referring to FIG. 1, the device 100 comprises a bit-line 101, a PCM 102, a liner 103, and a word-line 104. According to at least one embodiment, the PCM 102 includes, sequentially, a top electrode, a layer of phase change material such as GST (germanium-antimony-tellurium or $Ge_2Sb_2Te_5$), a liner material, and bottom electrode. According to some embodiments of the present invention, the liner material comprises a conductive oxide (e.g., aluminum (Al) doped zinc oxide (ZnO), hereinafter AZO) thin film. The liner material can be formed by, for example, doping ZnO with Al (AZO), doping indium oxide with tin (ITO) or doping other metal oxides to make a conductive oxide, or by depositing a conductive oxide.

According to some embodiments of the present invention, the liner acts as an inert cap. According to some embodiments of the present invention, the liner acts as a thermal barrier that reduces heat loss to the underlying bottom electrode during electrical programming (amorphization or crystallization) of the PCM. According to one or more embodiments of the present invention, ZnO is a semiconductor material, and its resistance can be controlled precisely by Al doping.

Figure 2:
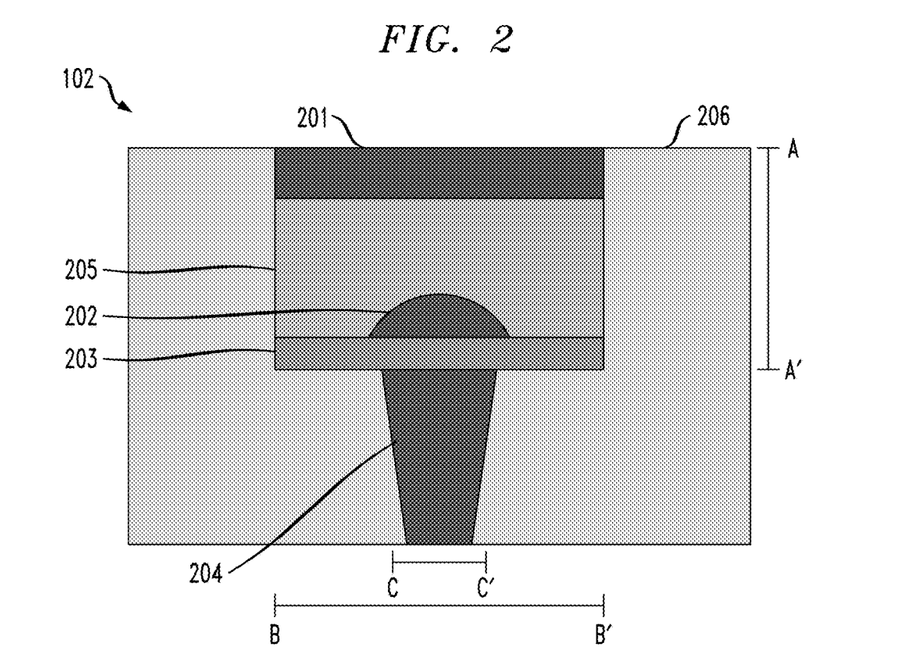
FIG. 2 is a PCM cell including a liner formed of conductive oxide according to some embodiments of the present invention.

Referring to FIG. 2, according to some embodiments, the PCM 102 comprises a top electrode 201 (e.g., formed of a metal or a metal nitride (XN where X may be any transition metal forming stable nitride such as tantalum (Ta), titanium (Ti), or tungsten (W)), a phase change material 202/205 (e.g., GST), a conductive oxide liner material 203, and bottom electrode 204 (e.g., formed of a metal or metal nitride (XN where X may be any transition metal forming stable nitride such as Ta, Ti, or W)).

The phase change material 202/205 can comprise a first portion 202 and/or a second portion 205. It should be understood that GST is useful as a medium of storage or memory given its ability to affect a reversible phase change when heated and cooled rapidly, or heated slowly, switching between an amorphous state and a crystalline state. According to one or more embodiments, the first portion of GST 202 is an amorphous state GST and the second portion of GST 205 is a crystalline state GST. The portion 202 may be electrically programmed to a crystalline state GST. It should be understood that portions 202 and 205 are the same material, and that the presence of portion 202 depends on the state of the device (i.e., if the GST is amorphized into RESET (high resistance), then portion 202 is present.

According to some embodiments, the PCM 102 is disposed in a dielectric layer 206. According to some embodiments, the dielectric layer 206 can be silicon dioxide ($SiO_2$), silicon nitride ($SiN_x$), aluminium oxide ($Al_2O_3$), etc.

According to some embodiments, the PCM 102 has a thickness (A-A') of about 20 nanometers (nm) to 100 nm and a lateral size (B-B') of about 40 nm to 500 nm, and a bottom contact size of about 10 nm to 50 nm.

According to some embodiments, the conductive oxide liner material 203 does not significantly oxidize in air and therefore acts as an inert cap. Moreover, the conductive oxide liner material 203 maintains its resistance even when exposed (e.g., to the ambient). According to some embodiments, the liner acts as a thermal barrier between the PCM and the bottom electrode. Within the conductive oxide liner material 203, the layer comprised of metal oxide (e.g., InOx, ZnOx) is a semiconductor and its resistance can be controlled precisely by metal doping (e.g., tin (Sn), Al). The conductive oxide liner material 203 can be deposited by atomic layer deposition (ALD) or physical vapor deposition (PVD). According to some embodiments, the conductive oxide liner material 203 has a thickness of about 1-15 nanometers (nm). According to some embodiments, a thickness of the conductive oxide liner is tuned proportionally to a thickness of the PCM layer to achieve good reversible phase change characteristics. For example, for devices of FIG. 4 and FIG. 8, dependent on the thickness of the conductive oxide liner, it may have a resistivity of about 0.1 to 10 times that of the resistivity of the PCM crystalline resistivity.

Figure 3:
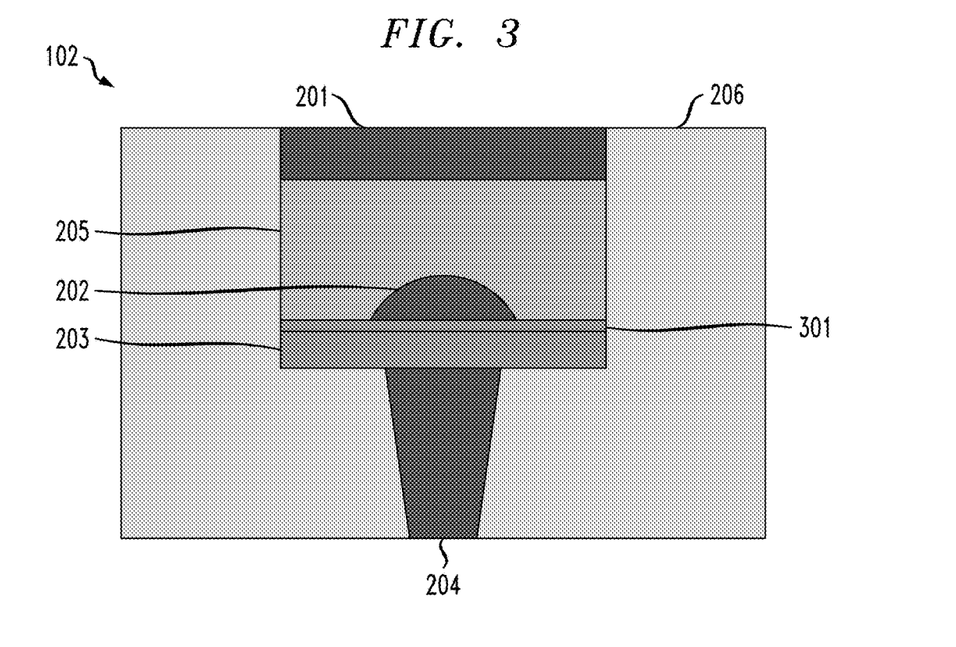
FIG. 3 is a PCM cell including a liner formed of metal and conductive oxide according to some embodiments of the present invention.

Referring to FIG. 3, according to some embodiments, the PCM 102 comprises the top electrode 201, the layer of GST 202/205, a layer of Al 301 over the conductive oxide liner material 203, and the bottom electrode 204. The PCM 102 is disposed in the layer of 206.

Figure 4:
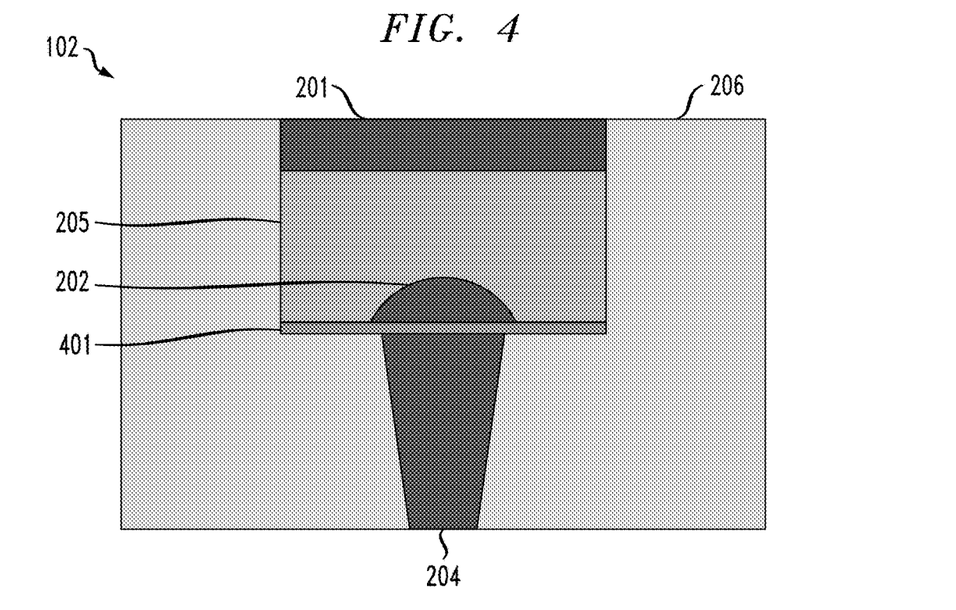
FIG. 4 is a PCM cell including a liner formed of metal according to some embodiments of the present invention.

Referring to FIG. 4, according to some embodiments, the PCM 102 comprises the top electrode 201, the layer of GST 202/205, a layer of Al 401, and the bottom electrode 204. The PCM 102 is disposed in the layer of 206.

According to some embodiments, the metal liner material 401 may be comprised of Al and has a thickness of about 10 nanometers (nm). The metal liner material 401 can be deposited by sputtering, evaporation, chemical vapor deposition (CVD), etc. According to some embodiments, after deposition, the metal liner material 401 can be annealed, for example, by a forming gas (FG) anneal, etc. Table 1 lists a process for a conventional control structure (Control). Table 1 further lists exemplary liners and structures, and their associated average resistance drift on reset (i.e., of the PCM), according to embodiments of the present invention. In Table 1, the liners are given with an as-deposited (As-dep) temperature.

Figure 5:
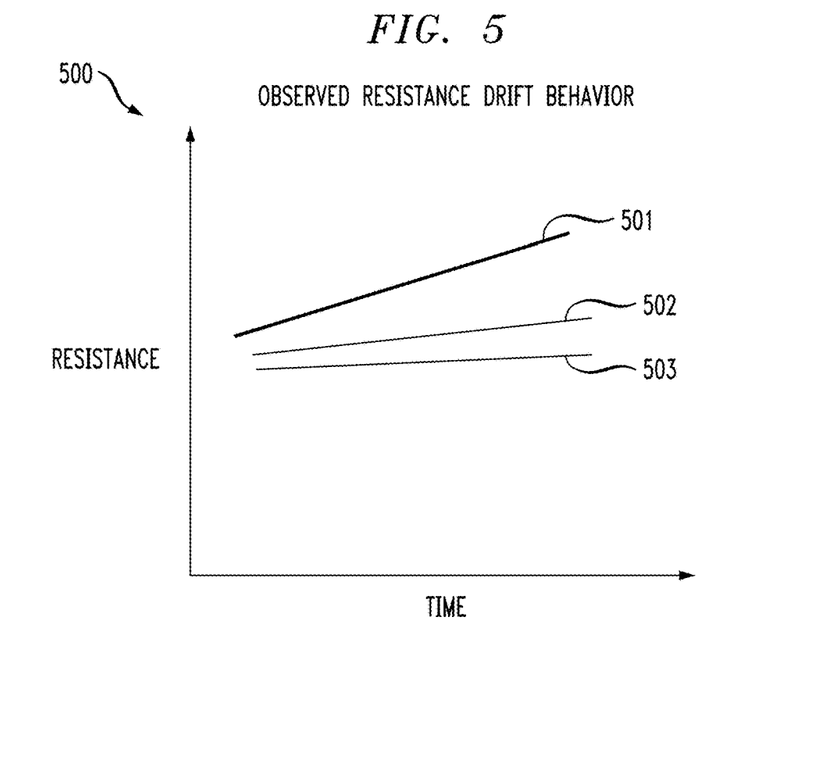
FIG. 5 is a graph of resistance over time for different liners according to some embodiments of the present invention.

FIG. 5 is a graph 500 of resistance over time for different liners according to some embodiments of the present invention. The resistance of the conventional device 501 with a GST only is higher than either the GST with a conductive oxide liner 502 or the GST with an conductive oxide/Al liner 503.

TABLE 1

| Liners | Structure | Avg. $R_{drift}$ Reset |
| --- | --- | --- |
| Control 200°, 250°, 300° C. | TiN/GST/TaN | 0.07 @ 200° C./15 min. anneal 0.16 @ 250° C./15 min. anneal |

TABLE 1-continued

| Liners | Structure | Avg. $R_{drift}$ Reset |
|---|---|---|
| | | 0.08 @ 300° C./100 sec. anneal |
| conductive oxide As-dep, 400° C. (forming gas (FG) anneal) | TiN (bottom electrode)/ CONDUCTIVE OXIDE/ GST/TaN (top electrode) | ~0.006 |
| Al As-dep, 400° C. | TiN/Al/GST/TaN | ~0.023-0.03 |
| conductive oxide/Al As-dep, 400° C. (FG) | TiN/conductive oxide/ Al/GST/TaN | ~0.01 |

Figure 6:
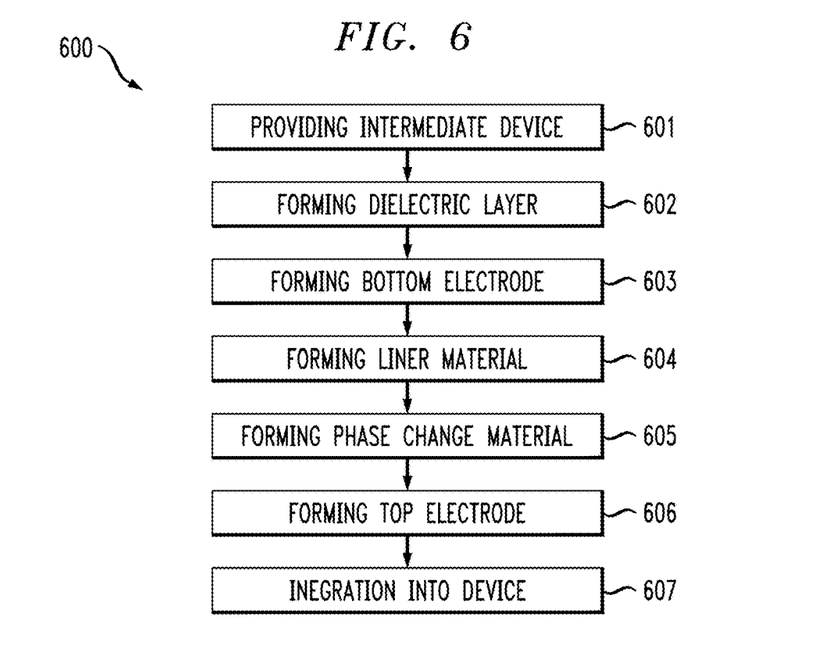
FIG. 6 is a flow diagram of a method of manufacturing a PCM device according to some embodiments of the present invention.

Referring to FIG. 6, according to some embodiments a method of manufacturing a PCM device comprises providing an intermediate Front-End Of Line (FEOL) or BEOL wafer including a word-line and liner (see FIG. 1) at block 601, forming the dielectric layer 206 at block 602, forming the bottom electrode 204 at block 603, forming the liner material 203 at block 604, forming the phase change material 202/205 at block 605, forming the top electrode 201 at block 606, and integrating the PCM device into a computer device at block 607 (e.g., including forming the bit-line 101).

As described below, the dielectric layer 206 can be formed as one or more layers, wherein the formation of a component, such as the liner material at block 604, may further include the deposition and patterning of a layer of the dielectric.

According to one or more embodiments, the bottom electrode 204 is embedded in the dielectric layer 206. Although a single bottom electrode 204 is described and illustrated, a plurality of bottom electrodes may be formed into the dielectric layer 206.

According to some embodiments, the dielectric layer 206 is formed of, for example, $SiO_2$, $Si_3N_4$, silicon oxynitride ($N_2OSi_2$), silsesquioxanes, or carbon doped oxides (i.e., organosilicates) that include atoms of Si, C, and H. In some embodiments, the dielectric layer 206 is non-porous. In other embodiments, the dielectric layer 206 is porous. In some embodiments, a single dielectric material can be used as the dielectric layer 206. In another embodiment, a plurality of dielectric materials may be used as the dielectric layer 206.

According to some embodiments, the dielectric layer 206 is formed on a base substrate (not shown). The base substrate may include a semiconductor material, an insulator material, and/or conductive material (e.g., a word-line). The dielectric layer 206 can be formed utilizing a deposition process including, for example, CVD, plasma enhanced chemical vapor deposition (PECVD), spin-on coating, evaporation, chemical solution deposition, etc.

In some embodiments, a first opening is formed into the dielectric layer 206 and then bottom electrode 204 is formed within the first opening 603. The first opening can be formed utilizing lithography and etching. Lithography includes providing a photoresist material (not shown) on an upper surface of the dielectric layer 206, exposing the photoresist material to a desired pattern of radiation, and thereafter developing the exposed photoresist material utilizing a conventional resist developer. Etching is then used to transfer the pattern from the patterned photoresist material into the underlying dielectric layer 206. Etching may include a dry etch process (such as, for example, reactive ion etching (RIE), ion beam etching, plasma etching and/or laser ablation), and/or a wet chemical etch process. In one embodiment, RIE is used to provide the opening in the dielectric layer 206. In some embodiments, an anisotropic etch is used that provides an opening with vertical sidewalls. In other embodiments, an isotropic etch is used that provides an opening with non-vertical (i.e., sloping) sidewalls. Following the pattern transfer, the photoresist material can be removed by utilizing a resist stripping process such as, for example, ashing.

After forming the opening within the dielectric layer 206, the bottom electrode 204 is formed by deposition of a conductive metallic material into the opening at block 603. According to some embodiments, the conductive metallic material that provides the bottom electrode 204 is, for example, titanium nitride (TiN), tungsten (W), silver (Ag), gold (Au), aluminum (Al) or multilayered stacks thereof. The conductive metallic material can be formed by a deposition process such as, for example, CVD, PECVD, physical vapor deposition (PVD), sputtering, atomic layer deposition (ALD) or plating. A planarization process or an etch back process may follow the deposition of the conductive metallic material that provides the bottom electrode 204 in a case where the dielectric layer 206 is deposited as multiple layers.

According to some embodiments, the bottom electrode 204 is formed on a surface of a base substrate (not shown) by deposition of a conductive metallic material, followed by patterning the deposited conductive metallic material by lithography and etching. The dielectric layer 206 can then be formed by deposition of a dielectric material, followed by planarization or an etch back process.

According to one or more embodiments of the present invention, a second opening is formed in the dielectric layer 206 (e.g., in a second portion of the dielectric layer 206 formed over the bottom electrode 204), and the liner material 203 is formed in the second opening at block 604. According to some embodiments, the liner material 203 can be deposited by Atomic Layer Deposition (ALD) or sputtering. According to at least one embodiment, the liner material 203 is planarized after deposition, using similar process steps as those described in connection with the bottom electrode 204.

According to one or more embodiments of the present invention, a third opening is formed in the dielectric layer 206 (e.g., in a third portion of the dielectric layer 206 formed over the liner material 203), and the phase change material 202/205 is formed in the third opening at block 605. The phase change material 202/205 can include the first and/or second portions of GST 202/205. According to at least one embodiment, the phase change material 202/205 is planarized after deposition, similar to those described in connection with the bottom electrode 204.

According to one or more embodiments of the present invention, a fourth opening is formed in the dielectric layer 206 (e.g., in a third portion of the dielectric layer 206 formed over the phase change material 202/205), and the top electrode 201 is formed in the fourth opening at block 606. This embodiment includes the processing steps for planarizing the top electrode 201, similar to those described in connection with the bottom electrode 204.

Recapitulation:

According to an embodiment of the present invention, a Phase-Change Memory (PCM) device includes a dielectric layer 206, a bottom electrode 204 disposed in the dielectric layer, a liner material 203 disposed on the bottom electrode and in the dielectric layer, a phase-change material 202/205 disposed on the liner material and in the dielectric layer, and a top electrode 201 disposed on the phase-change material and in the dielectric layer.

According to some embodiments, method of manufacturing a Phase-Change Memory (PCM) device comprises providing a substrate 601, forming a first structure 602/603 comprising a first dielectric layer and a bottom electrode, wherein the bottom electrode is disposed in the first dielectric layer and the bottom electrode and the first dielectric layers are disposed on the substrate, forming a liner material 604 disposed on the bottom electrode and in a second dielectric layer, forming a phase-change material 605 on the liner material and in a third dielectric layer, and forming a top electrode 606 disposed on the phase-change material and in a fourth dielectric layer.

Figure 7:
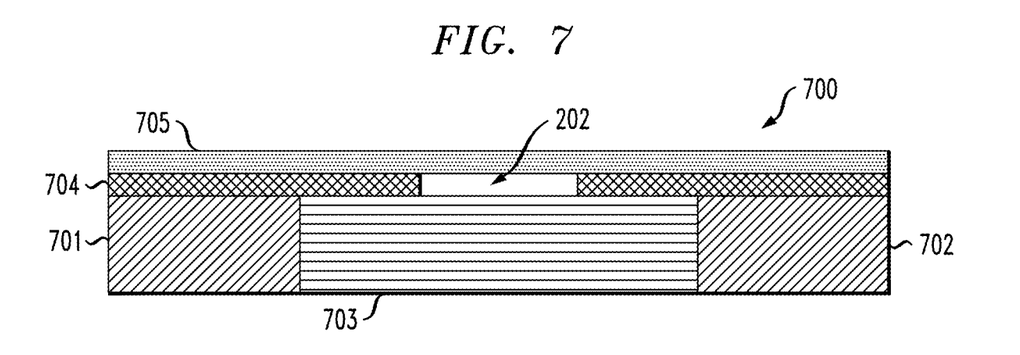
FIG. 7 is a PCM cell configured as a bridge cell according to some embodiments of the present invention.
Figure 8:
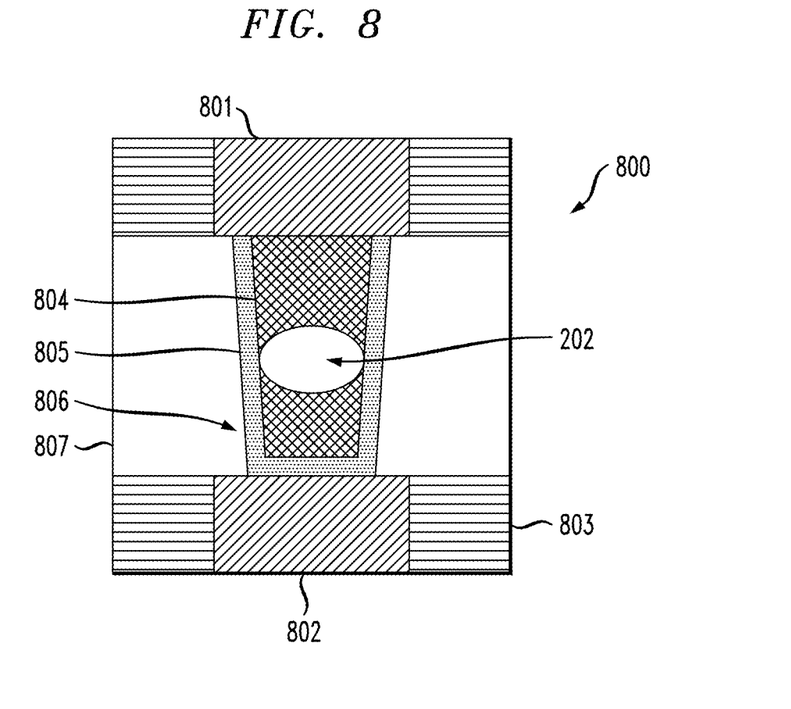
FIG. 8 is a PCM cell configured as a confined cell according to some embodiments of the present invention.

According to one or more embodiments, a PCM device can have various other configurations (see for example, FIG. 7 and FIG. 8). For example, a PCM device according to some embodiments is configured as a bridge cell 700 (see FIG. 7), comprising a conductive oxide liner material 705 disposed over a thin PCM 704. The PCM 704 is formed on first and second metal electrodes 701 and 702, which are separated by a interlayer dielectric (ILD) 703.

According to some embodiments, a PCM device is configured as confined cell device 800 (see FIG. 8), comprising a conductive oxide 805 lining a via 806 formed in an intermediate layer 807 and surrounding the PCM 804. The confined cell device comprises a top electrode 801 and a bottom electrode 802, each disposed in a dielectric, e.g., 803. The top electrode 801 is disposed above the via and contacts upper surfaces of the conductive oxide 805 and the PCM 804. The bottom electrode 802 is disposed below the via and contacts a lower surface of the conductive oxide 805.

According to some embodiments, the sidewalls of the via 806 can have different configurations, for example, being vertical sidewalls. According to some embodiments, the liner 805 can be disposed only on the sidewalls of the via 806, such that a lower surface of the PCM 804 directly contacts the top electrode 801 and the bottom electrode 802. According to one or more embodiments, the PCM 804 is separated from one or more of the electrodes 801-802 by the liner 805.

As illustrated in FIG. 7 and FIG. 8, and as described herein, the presence of the amorphous PCM (a-PCM) portion 202 of the PCM depends on the state of the device.

Recapitulation:

According to an embodiment of the present invention, a Phase-Change Memory (PCM) device 102 includes a dielectric layer 206, a bottom electrode 204 disposed in the dielectric layer, a liner material 203 disposed on the bottom electrode, a phase-change material 205 disposed on the liner material, and a top electrode 201 disposed on the phase-change material and in the dielectric layer.

According to some embodiments, method of manufacturing a Phase-Change Memory (PCM) device comprises providing a substrate 601, forming a first structure comprising a first dielectric layer 602 and a bottom electrode 603, wherein the bottom electrode is disposed in the first dielectric layer and the bottom electrode and the first dielectric layers are disposed on the substrate, forming a liner material 604 disposed on the bottom electrode and in a second dielectric layer, forming a phase-change material 605 on the liner material and in a third dielectric layer, and forming a top electrode 606 disposed on the phase-change material and in a fourth dielectric layer.

According to some embodiments, a Phase-Change Memory (PCM) device comprises a dielectric layer 703, a first electrode 701 disposed on a first side of the dielectric layer, a second electrode 702 disposed on a second side of the dielectric layer, opposite the first electrode, a phase-change material 704 disposed on the dielectric layer and the first and second electrodes, and a liner material 705 disposed on the phase-change material.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A Phase-Change Memory (PCM) device comprising:
   a dielectric layer;
   a bottom electrode disposed in the dielectric layer;
   a liner material disposed on the bottom electrode;
   a phase-change material disposed on the liner material; and
   a top electrode disposed on the phase-change material and in the dielectric layer.

2. The PCM of claim 1, wherein the bottom electrode is formed of one of a first metal and a first metal nitride, and the top electrode is formed of one of a second metal and a second metal nitride, wherein the bottom electrode and the top electrode are formed of one of a same material and a different material.

3. The PCM of claim 1, wherein the liner material and the phase-change material are disposed in the dielectric layer.

4. The PCM of claim 1, wherein the dielectric layer includes a first dielectric layer and a second dielectric layer and the bottom electrode is formed in the first dielectric layer and the top electrode is formed in the second dielectric layer,
   wherein the liner material and the phase-change material are disposed in a via formed in an intermediate layer between the first dielectric layer and the second dielectric layer, and
   further wherein the liner material contacts the top electrode and the bottom electrode.

5. The PCM of claim 1, wherein the liner material comprises a conductive oxide thin film.

6. The PCM of claim 5, wherein the conductive oxide thin film is one of an Al doped ZnO (AZO), a doped indium oxide with tin (ITO), and a doped metal oxide.

7. The PCM of claim 1, wherein the liner material further comprises a metal layer formed of Al disposed over a conductive oxide thin film.

8. The PCM of claim 7, wherein the conductive oxide thin film is an Al doped ZnO (AZO).

9. The PCM of claim 1, wherein the liner material is an Al layer.

10. The PCM of claim 1, wherein the dielectric layer comprises a plurality of dielectric layers.

11. A method of manufacturing a Phase-Change Memory (PCM) device comprising:
    providing a substrate;
    forming a first structure comprising a first dielectric layer and a bottom electrode, wherein the bottom electrode is disposed in the first dielectric layer and the bottom electrode and the first dielectric layers are disposed on the substrate;
    forming a liner material disposed on the bottom electrode and in a second dielectric layer;
    forming a phase-change material on the liner material and in a third dielectric layer; and
    forming a top electrode disposed on the phase-change material and in a fourth dielectric layer.

12. The method of claim 11, wherein the bottom electrode is formed of a first metal or metal nitride and the top electrode is formed of a second metal or metal nitride, wherein the first metal nitride and the second metal nitride are one of a same metal nitride and different metal nitrides.

13. The method of claim 11, wherein the liner material comprises a conductive oxide thin film.

14. The method of claim 13, wherein the conductive oxide thin film is one of an Al doped ZnO (AZO), a doped indium oxide with tin (ITO), and a doped metal oxide.

15. The method of claim 11, wherein forming the liner material further comprises:
    forming an conductive oxide thin film on the bottom electrode; and
    forming a metal layer on the conductive oxide thin film.

16. The method of claim 15, wherein the metal layer is formed of Al.

17. The method of claim 15, wherein the conductive oxide thin film is one of an Al doped ZnO (AZO), a doped indium oxide with tin (ITO), and a doped metal oxide.

18. The method of claim 11, wherein the liner material is an Al layer.

19. The method of claim 11, further comprising depositing and patterning, sequentially, the first, second, third, and fourth dielectric layers.

20. A Phase-Change Memory (PCM) device comprising:
- a dielectric layer;
- a first electrode disposed on a first side of the dielectric layer;
- a second electrode disposed on a second side of the dielectric layer, opposite the first electrode;
- a phase-change material disposed on the dielectric layer and the first and second electrodes; and
- a liner material disposed on the phase-change material.

* * * * *